(12) United States Patent
Arvet et al.

(10) Patent No.: US 10,056,470 B2
(45) Date of Patent: Aug. 21, 2018

(54) CONSUMPTION OF THE CHANNEL OF A TRANSISTOR BY SACRIFICIAL OXIDATION

(71) Applicant: Commissariat A L'Energie Atomique et aux Energies Alternatives, Paris (FR)

(72) Inventors: Christian Arvet, Bernin (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/408,793

(22) Filed: Jan. 18, 2017

(65) Prior Publication Data

US 2017/0207320 A1    Jul. 20, 2017

(30) Foreign Application Priority Data

Jan. 19, 2016  (FR) ..................... 16 50393

(51) Int. Cl.
   *H01L 21/302*   (2006.01)
   *H01L 29/66*    (2006.01)
   (Continued)

(52) U.S. Cl.
   CPC .. *H01L 29/66636* (2013.01); *H01L 21/02238* (2013.01); *H01L 21/31111* (2013.01); *H01L 21/31116* (2013.01); *H01L 21/76831* (2013.01)

(58) Field of Classification Search
   CPC .............. C07K 14/415; C12N 15/8261; C12N 15/8214; C12N 15/8216; C12N 15/8247;
   (Continued)

(56) References Cited

U.S. PATENT DOCUMENTS

2003/0082862 A1* 5/2003 Richter ............ H01L 21/26506
                                                        438/197
2004/0072446 A1   4/2004 Liu et al.
                                    (Continued)

FOREIGN PATENT DOCUMENTS

EP          2 765 613 A1    8/2014

OTHER PUBLICATIONS

French Preliminary Search Report dated Oct. 12, 2016 in French Application 16 50393, filed on Jan. 19, 2016 ( with English Translation of categories of Cited Documents and Written Opinion).

*Primary Examiner* — Lan Vinh
(74) *Attorney, Agent, or Firm* — Oblon, McClelland, Maier & Neustadt, L.L.P.

(57) ABSTRACT

A method for manufacturing a transistor is provided, the transistor including a gate disposed above an underlying layer of a semiconductor material, the gate including at least one first flank and at least one second flank, and a gate foot disposed under the gate in the underlying layer and protruding relative to a peripheral portion of the underlying layer, the peripheral portion surrounding the gate foot; and the method including forming a selectivity layer obtained from an original layer and disposed only above the peripheral portion of the underlying layer, and selective etching, with respect to the selectivity layer, of the material of the original layer so as to etch the gate foot.

16 Claims, 3 Drawing Sheets

(51) Int. Cl.
*H01L 21/311* (2006.01)
*H01L 21/02* (2006.01)
*H01L 21/768* (2006.01)

(58) Field of Classification Search
CPC ............ C12N 15/8251; C12N 15/8267; C12N 15/8271; C12N 15/8273; C12N 15/8282; C12N 15/827; Y02A 40/146; H01L 21/02238; H01L 21/31111; H01L 21/31116; H01L 29/66636; H01L 21/76831
USPC ....... 438/739, 735, 736, 745, 753, 756, 765, 438/738
See application file for complete search history.

(56) References Cited

U.S. PATENT DOCUMENTS

| | | | |
|---|---|---|---|
| 2005/0176205 A1* | 8/2005 | Chien | H01L 29/665 438/299 |
| 2005/0272187 A1* | 12/2005 | Murthy | H01L 29/41733 438/151 |
| 2005/0280051 A1* | 12/2005 | Chidambarrao | H01L 21/76232 257/274 |
| 2010/0295127 A1 | 11/2010 | Cheng et al. | |
| 2011/0204384 A1 | 8/2011 | Cheng et al. | |
| 2012/0273886 A1 | 11/2012 | Zhong et al. | |
| 2014/0264440 A1 | 9/2014 | Chen et al. | |
| 2014/0335663 A1 | 11/2014 | Niebojewski et al. | |
| 2016/0254366 A1 | 9/2016 | Chen et al. | |

* cited by examiner

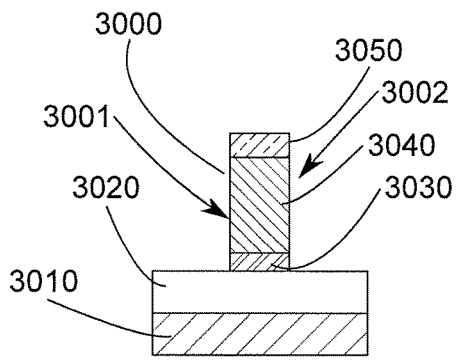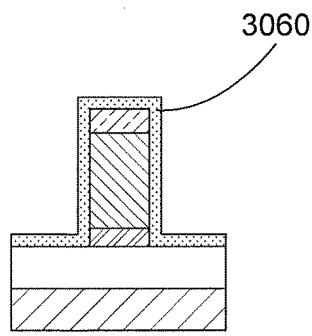
FIG. 3a  FIG. 3b
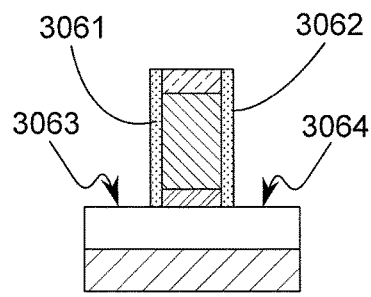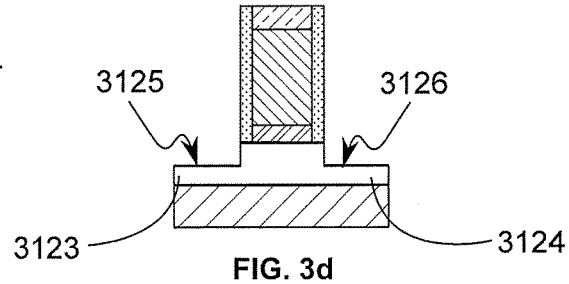
FIG. 3c  FIG. 3d
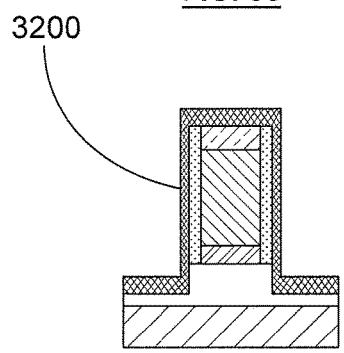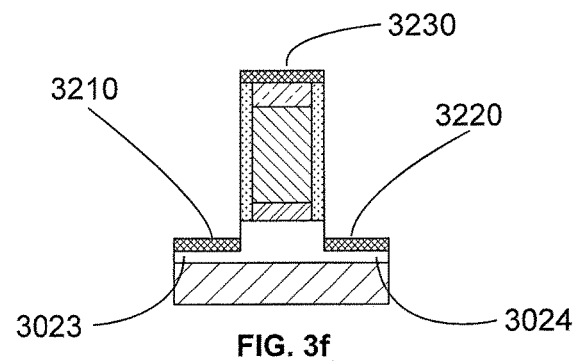
FIG. 3e  FIG. 3f
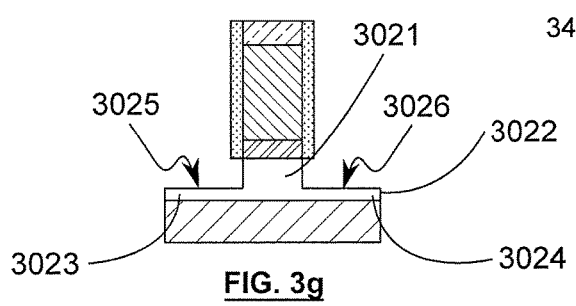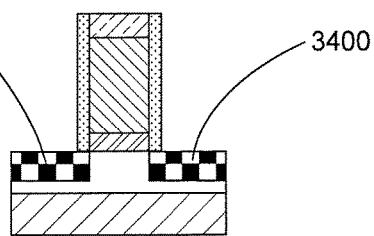
FIG. 3g  FIG. 3h

CONSUMPTION OF THE CHANNEL OF A TRANSISTOR BY SACRIFICIAL OXIDATION

TECHNICAL FIELD OF THE INVENTION

This invention relates to transistors, particularly transistors of the MOS (Metal Oxide Semi-Conductor) type and more particularly the creation of the channel, for example, of silicon.

The microelectronics industry, which here is understood as including nanotechnology, is concerned by the invention, in the use of field effect transistors and in particular MOSFET transistors widely used in integrated circuits.

PRIOR ART

The development that the microelectronics industry has known was favored in the creation, in the 1970s, of transistors of the MOSFET type of which the source and drain electrodes are self-aligned on those of the gates which avoids a photoengraving for their defining. In particular, with gates with a polycrystalline silicon base, it is the gates themselves, made first, that are used as a mask during the doping of the source and drain zones of transistors.

This type of transistor comprises a gate, and a source and a drain globally designated as source/drain zones, since they are very generally perfectly symmetrical and can play the two roles according to the electrical polarizations that are applied to the transistor.

FIG. 1a is a cross-section view of an embodiment of a gate 1000. The gate 1000 is conventionally constituted of a stack of layers (1030, 1040, 1050) of which a large portion is always comprised of polycrystalline silicon 1040. The formation of the source and drain zone 1100, 1200 is typically carried out by ionic implantation of dopants in the zones 1100, 1200, with the gate 1000 serving as a mask as mentioned hereinabove, as such preventing the doping of the zone of the transistor in which, according to the voltages applied to the gate 1000, the conduction channel 1021 will be able to develop between source and drain.

The basic technique, very briefly described hereinabove, has been constantly perfected with the purpose of improving the electrical performance of the transistors while still making it possible to accommodate the successive reductions in the size of transistors required by an every-increasing integration of a larger number of components in an integrated circuit.

A currently used technique consists in manufacturing integrated circuits using developed substrates of the silicon on insulator type, designated by their acronym SOI. The elaborated SOI substrate is characterized by the presence of a thin original layer of monocrystalline silicon 1020 resting on a continuous insulating oxide layer 1010 in particular made of silicon, referred to as buried oxide or the acronym BOX for "buried oxide layer". The solidity and the mechanical rigidity of the whole are provided by a layer that forms the body of the SOI substrate, often qualified as "bulk" in order to indicate that the starting substrate is very generally made from solid silicon. This structure offers many advantages for the realization of MOSFET transistors. With regards to the invention, retain only that the original layer 1020 for example made of monocrystalline silicon can be controlled precisely in thickness and in doping. In particular, it is advantageous for the performance of transistors that the channel 1021 can be fully devoid of carriers, i.e. "fully depleted" (FD), which is generally used to designate this state. This is obtained by carrying out the transistors using SOI substrates of which the original layer 1020 is very thin. This type of transistor is as such designated by the acronym FDSOI.

A perfecting of the basic technique of self-alignment which has been universally adopted consists in the formation of spacers 1061, 1062 on the flanks of the gate 1000. In order to be able to maintain low electrical resistances for access to the source and drain electrodes, despite the reduction in size of transistors, it was then necessary to increase their section. This is obtained by selective epitaxy of the source/drain zones 1100, 1200. During this operation the original initial layer 1020 of monocrystalline silicon will be increased locally. It is then necessary to protect the gate zones in order to prevent the growth from occurring also from the polycrystalline silicon 1040 of the gate. It is, among other things, the role of the spacers to provide this function. They also provide a role of preserving the gate during the silicifying of the contacts (not shown) which is then carried out with the same purpose in order to decrease the serial resistance access to the electrodes of the transistor.

The formation of spacers 1061, 1062 has become a crucial step in the formation of transistors which now reach dimensions that are commonly measured in nanometers (nm=$10^{-9}$ meters) and which are globally of decananometric sizes. The realization of the spacers 1061, 1062 is carried out in this technology without calling into play any photoengraving operation.

In order to achieve this, FIG. 1b shows the formation of a first nitride layer 1060, in particular of silicon nitride (SiN). This layer is then subjected, in the step of FIG. 1c, to a highly anisotropic etching in such a way that the etching suppresses the portions of the layer 1060 located on the original layer 1020 (which are generally horizontal, i.e. directed perpendicularly to the thickness of the substrate) while still preserving, at least partially, the nitride on the non-horizontal portions and particularly on the portions that form the flanks of the gate 1000.

FIG. 1d shows the following step aiming to reduce the dimensions of the silicon channel in such a way as to arrange the source/drain zones as close as possible to the channel 1021. This reduction in physical dimensions is commonly carried out by a chemical or inductively-coupled plasma isotropic etching by using SF6 base chemistry for example. This step, well known to those skilled in the art, allows for an isotropic etching of the original layer 1020. The etching is therefore carried out identically, both vertically and horizontally. The precise control of the sizing of the silicon channel 1021 is then problematic.

The technology described as such is complex, especially due to the number of steps implemented. Generally, and this even for the realization of spacers of a single level, the current techniques do not make it possible to precisely control the etching phases and therefore the final shape of the portions comprised of the transistor, in particular the shape of the base of the spacers.

This invention makes it possible to respond to at least one portion of the disadvantages of the current techniques by providing an ingenious method for sizing the silicon channel.

SUMMARY OF THE INVENTION

This invention relates to a method for manufacturing a transistor, with the transistor comprising:
  a gate located above an underlying layer of a semiconductor material, said gate comprising at least one first flank and at least one second flank, a gate foot formed in said underlying layer under the gate and protruding relatively to a peripheral portion of the underlying layer, the peripheral portion surrounding the gate foot, Advantageously, the method comprises at least:

A formation of a selectivity layer using an original layer only above said peripheral portion of the underlying layer. Preferably, the selectivity layer is obtained by at least:

A transformation of at least a portion of the material of the original layer in such a way as to form a portion of transformed material configured to entirely cover said gate foot;

A partial removal of at least one portion of said portion of transformed material in such a way as to retain a layer of transformed material forming the selectivity layer above said peripheral portion and in such a way as to expose at least partially said gate foot;

A selective etching with respect to the selectivity layer of the material of the original layer configured to form said gate foot.

This method as such makes it possible to form a gate foot, from an anisotropic etching, of which the geometrical parameters are precisely controlled in such a way as to define with precision the channel of the transistor. The dopants can as such be brought as close as possible to the silicon channel.

This method then allows for a reduction in the width of the channel that separates the source and the drain of the transistor.

Another aspect of this invention relates to a microelectronic device provided with at least one transistor comprising a gate with a gate foot, more preferably straight, of width less than or equal to the width of the gate and advantageously of a width strictly less than the width of the gate and of the spacers.

BRIEF DESCRIPTION OF THE FIGURES

The purposes and objects as well as the characteristics and advantages of the invention shall appear better in the detailed description of an embodiment of the latter which is shown by the following accompanying drawings wherein:

FIGS. 3a to 3h show steps according to a second embodiment of the invention.

Figure 1A:
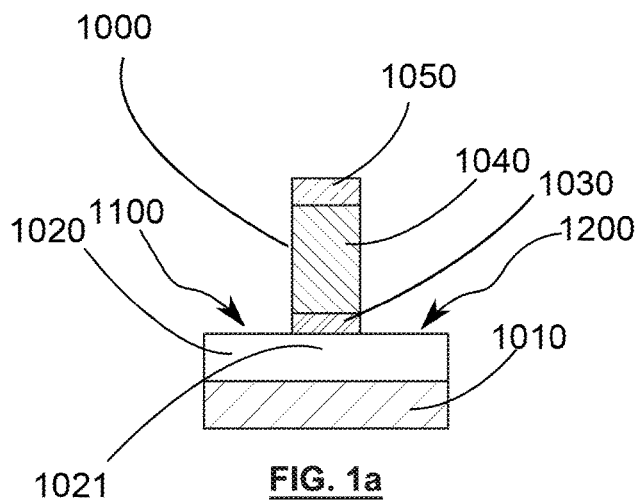
FIGS. 1a to 1d show successive conventional phases of the realization of an isotropic etching of the underlying layer of silicon.
Figure 1B:
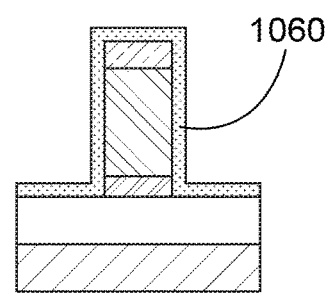
Figure 1C:
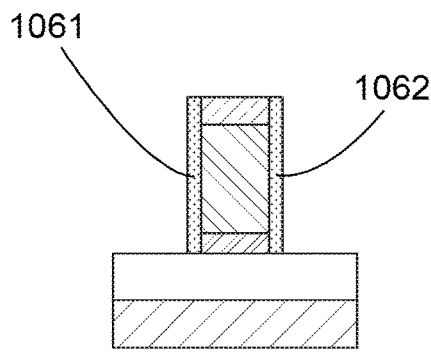
Figure 1D:
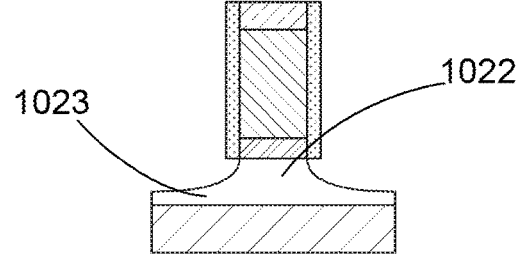

The drawings joints are given by way of examples and do not limit the invention.

These drawings are diagrammatical representations and are not necessarily to the scale of the practical application. In particular, the relative thicknesses of the layers and of the substrates do not represent reality.

DETAILED DESCRIPTION OF THE INVENTION

It is specified that in the framework of this invention, the term "on", "overmounts" or "underlying" or their equivalent does not necessarily mean "in contact with". As such for example, the deposition of a first layer on a second layer, does not necessarily mean that the two layers are directly in contact with one another but this means that the first layer covers at least partially the second layer by being, either directly in contact with it, or by being separated from it by another layer or another element.

In the description that follows, the thicknesses are generally measured according to directions perpendicular to the plane of the lower face of the layer to be etched or of a substrate whereon the lower layer is arranged. As such, the thicknesses are generally taken according to a vertical direction in the figures shown. On the other hand, the thickness of a layer covering a flank of a pattern is taken according to a direction perpendicular to this flank.

In what follows, the term selective etching means the removal via etching of a given material by preserving at least partially, via the selectivity of the method used, other materials.

The term "surface layer" corresponds to a layer that is formed, in particular by modification of the underlying layer or by a deposition on this underlying layer, on the surface of the electronic device after the formation of the underlying layer. It is then partially removed in order to partially remove the underlying layer. The adjective "surface" does not necessarily mean that the residual surface layer always remains on the surface of the device when the manufacture of the latter is finalized. It can be for example removed or covered.

The term "conformal" means a layer geometry that has, to the nearest manufacturing tolerances, a constant thickness despite the changes in the direction of the layer, for example on the gate pattern flanks.

The word "dielectric" corresponds to a material of which the electrical conductivity is sufficiently low in the given application to serve as insulation.

The term "from" means that the object formed comprises constituents of a preceding object. More precisely, a selectivity layer formed from an original layer is understood as follows: the selectivity layer is a transformed or not of the original layer.

The term "step" does not necessarily mean that the action or actions carried out during this step are simultaneous or immediately successive. Certain actions of a first step can in particular be followed by actions linked to another step, and other actions of the first step can be carried out afterwards. As such, the term step does not necessarily mean unitary and inseparable actions over time and in the chaining of the phases of the method.

In order to begin a detailed review of embodiments of the invention, listed hereinafter are optional characteristics that can possibly be used in association or alternatively:

The transformation of a portion at least of the material of the original layer comprises a step of oxidation of a portion at least of the material of the original layer.

The selectivity layer has a thickness strictly less than the height of said gate foot in such a way as to allow for a lateral access to said gate foot.

The transformation of at least a portion of the material of the original layer is configured in such a way that said peripheral portion of the underlying layer has a thickness at least equal to 3 nm.

The selectivity layer has a thickness preferentially at least equal to the thickness of the original layer less 3 nm or more, and is for example between 1 nm and 47 nm, advantageously between 3 nm and 45 nm.

The selective etching is an isotropic etching.

The method comprises a step of removing the selectivity layer after said selective etching.

The step of removing the selectivity layer is carried out by at least one anisotropic etching.

The method comprises a step of forming at least one spacer, said step of forming the at least one spacer comprising the forming of a dielectric layer covering at least partially said first flank and said second flank of the gate in such a way as to not cover at least partially said gate foot.

The formation of the dielectric layer is followed by a step of removing the dielectric layer on a surface of the original layer.

Said removal of the dielectric layer is carried out in such a way as to leave the first flank and the second flank of the gate covered with the dielectric layer in such a way as to form the at least one spacer.

The step of removing the dielectric layer is carried out by dry etching.

The step of formation of the selectivity layer is carried out after the step of forming the at least one spacer.

The step of formation of the selectivity layer is carried out by a step of transformation of a portion of material of the original layer, followed by a step of partial removal of at least one portion of said portion of transformed material in such a way as to retain above said peripheral portion of the underlying layer a layer of transformed material forming the selectivity layer.

The step of formation of the selectivity layer is carried out by a step of partial removal of the original layer around the gate in such a way as to form a residual portion of the original layer, The step of partial removal of the original layer around the gate is followed by the step of transformation of the material of the original layer of said residual portion in such a way as to form a surface layer.

The step of transformation of the material of the original layer of said residual portion is followed by a step of at least partial removal of the surface layer carried out by at least one partial deoxidation on at least one flank of the foot of the gate before said selective etching.

The width of the gate is greater than or equal to the width of the gate foot. This makes it possible to decrease the section of the silicon channel on the source and the drain.

The oxidation is carried out over a thickness of the material of the original layer preferentially at least equal to the thickness of the original layer less 3 nm at least, and for example between 1 nm and 47 nm, advantageously between 3 nm and 45 nm.

The selective etching is a dry etching.

The step of at least partial removal of the selectivity layer is carried out by at least one wet etching.

The formation of the dielectric layer is carried out by a technique taken, for example, from at least: PECVD, PEALD.

At least one peripheral portion of the underlying layer has a thickness preferentially greater than or equal to 3 nm, and for example advantageously between 5 nm and 15 nm, and preferably equal to 10 nm.

It is advantageous to retain at least 3 nm of this peripheral portion of the underlying layer in order to allow for the following integration steps, such as for example the step of epitaxy.

The underlying layer comprises a semi-conductor material such as for example Silicon (Si).

This enables the method to be suitable with the existing technologies.

The original layer has a thickness between 5 nm and 50 nm, advantageously between 5 nm and 15 nm, and preferably equal to 10 nm.

The gate foot has a height preferentially between 8 nm and 12 nm, advantageously between 9 nm and 12 nm, and preferably equal to 10 nm.

The gate has a height preferentially between 30 nm and 100 nm, advantageously between 40 nm and 70 nm, and preferably equal to 50 nm.

The gate foot has a width between 5 nm and 50 nm, advantageously between 5 nm and 20 nm, and preferably equal to 10 nm.

The gate has a width between 5 nm and 50 nm, advantageously between 5 nm and 20 nm, and preferably equal to 10 nm.

The width of the gate is greater than the lateral width of the gate foot.

The width of the gate is equal to the lateral width of the gate foot.

The formation of the dielectric layer comprises at least one conformal deposition.

This makes it possible to cover all of the surfaces with the same thickness of material and as such to be able to control the steps of removing the layer identically over all of the surfaces.

The dielectric layer comprises at least one material taken from: silicon nitride (SiN), boron nitride (BN), any type of material of which the dielectric conductivity is less than or equal to 7.

This allows for the use of materials that are usually used for the formation of spacers.

The dielectric layer has a thickness between 1 nm and 30 nm, advantageously between 6 nm and 15 nm and preferably equal to 10 nm.

The step of removing the dielectric layer is carried out by dry etching by carbon fluorine plasma.

This makes it possible to carry out an anisotropic etching and therefore to etch the layer under consideration only according to a preferential direction, that of the thickness.

The step of removing the dielectric layer is carried out by at least one technique taken from at least: dry etching by carbon fluorine plasma with a CxFy or CxHyFz base.

This makes it possible to carry out an anisotropic etching and therefore to etch the layer under consideration only according to a preferential direction, that of the thickness.

The dielectric layer forms spacers. The spacers formed as such allow for the realization of the transistor without covering the gate foot constituting the silicon channel.

The step of partial removing of the original layer is configured to form a straight gate flank according to a dimension in thickness of the original layer.

The step of partial removal of the original layer comprises an anisotropic etching configured to attack only the portions of the original layer directed according to a dimension in thickness of said layer.

This makes it possible to carry out an anisotropic etching and therefore to etch the layer under consideration only according to a preferential direction, that of the thickness.

The step of formation of the dielectric layer is followed by a step of removing the dielectric layer on a surface of the peripheral portion of the underlying layer.

This makes it possible to remove the dielectric layer serving as a spacer of the zones surrounding the gate and preferentially peripheral portions of the underlying layer.

The step of removing the dielectric layer is carried out by dry etching.
  This makes it possible to carry out an anisotropic etching and therefore to etch the layer under consideration only according to a preferential direction, that of the thickness.
The step of removing the dielectric layer is carried out by at least one technique taken from at least: dry etching by carbon fluorine plasma with a CxFy or CxHyFz base.
  This makes it possible to carry out an anisotropic etching and therefore to etch the layer under consideration only according to a preferential direction, that of the thickness.
The step of removing the dielectric layer comprises a prior step of surface oxidation of the dielectric layer.
  This makes it possible to obtain better control of the sizing of the spacers during the etching.
The wet solution is a solution with a hydrofluoric acid base.
The step of partial removal of the selectivity layer is carried out by dry etching. This makes it possible to carry out an anisotropic etching and therefore to etch the layer under consideration only according to a preferential direction, that of the thickness.
The step of partial removal of the selectivity layer is carried out by dry etching by carbon fluorine plasma.
  This makes it possible to carry out an anisotropic etching and therefore to etch the layer under consideration only according to a preferential direction, that of the thickness.
The step of partial removal of the selectivity layer is carried out by at least one technique taken from at least: dry etching by carbon fluorine plasma with a CxFy or CxHyFz base.
  This makes it possible to carry out an anisotropic etching and therefore to etch the layer under consideration only according to a preferential direction, that of the thickness.
The step of removal of said selectivity layer is carried out by a chemical wet etching with a hydrofluoric acid base.
  This allows for an isotropic etching and as such to reduce the thickness of the additional spacers.

According to an embodiment, this invention can use elaborated substrates of the SOI type. The elaborated 501 substrate is characterized by the presence of an original layer (2020, 3020) resting on a continuous insulating oxide layer (2010, 3010).

This invention relates to a method for manufacturing a transistor comprising:
  a gate (2000, 3000) located above an underlying layer (2022, 3022) of a semi-conductor material, said gate (2000, 3000) comprising at least one first flank (2001, 3001) and at least one second flank (2002, 3002),
  a gate foot (2021, 3021) formed under the gate (2000, 3000) and protruding in said underlying layer (2022, 3022) relatively to a peripheral portion (2023, 2024, 3023, 3024) of the underlying layer (2022, 3022) surrounding the gate foot (2021, 3021).

The term "height of the gate foot (2021, 3021)" here means the height of the portion protruding relatively to the peripheral portion (2023, 2024, 3023, 3024) of the underlying layer (2022, 3022).

This invention relates to according to a preferred embodiment a method for manufacturing a transistor characterized by the fact that it comprises at least the following steps:

Formation of a dielectric layer (2060, 3060) covering at least partially said at least one first flank (2001, 3001) and said at least one second flank (2002, 3002) of the gate (2000, 3000) in such a way as to not cover at least partially said gate foot (2021, 3021);
Formation of said underlying layer (2022, 3022) from an original layer (2020, 3022), after the formation of the dielectric layer (2060, 3060), said formation comprising the formation of a transformed residual portion of said original layer (2020, 3020) in such a way as to form a selectivity layer (2110, 2210, 3210, 3220), with the obtaining of said transformed residual portion carried out by the transformation of the material of the original layer (2020, 3020);
Lateral isotropic etching of a portion of the original layer (2020, 3020) configured to form said gate foot (2021, 3021), said etching being selective in relation to said selectivity layer (2110, 2210, 3210, 3220);

According to an embodiment, the method according to this invention comprises at least one step of formation of the underlying layer (2022, 3022) with a step of formation of a transformed residual portion of the material of an original layer (2020, 3020), around the gate (2000, 3000) in such a way as to form a selectivity layer (2110, 2210, 3210, 3220), and in such a way as to form said gate foot (2021, 3021).

Advantageously, the step of formation of the underlying layer (2022, 3022) is carried out after a step of formation of a dielectric layer (2060, 3060) used for the formation of the spacers (2061, 2062, 3061, 3062) arranged on the at least one first flank (2001, 3001) and the at least one second flank (2002, 3002) of the gate (2000, 3000).

Advantageously, the step of formation of the underlying layer (2022, 3022) is carried out after a step of formation of the selectivity layer (2110, 2210, 3210, 3220) arranged above the peripheral portion (2023, 2024, 3023, 3024) of the underlying layer (2022, 3022) in such a way as to allow for a selective lateral isotropic etching of a portion of the original layer (2020, 3020) in such a way as to form said gate foot (2021, 3021).

Preferably, this method makes it possible to form a gate foot (2021, 3021) of which the physical parameters are precisely controlled in such a way as to define with precision the channel of the transistor by carrying out an isotropic etching. This then makes it possible, during the formation of the source and of the drain, to bring the latter as close as possible to the channel, as shown in FIGS. 2h and 3h hereinafter.

According to a preferred embodiment, the gate (2000, 3000) is formed by a conventional technique such as for example by plasma etching.

Figure 2A:
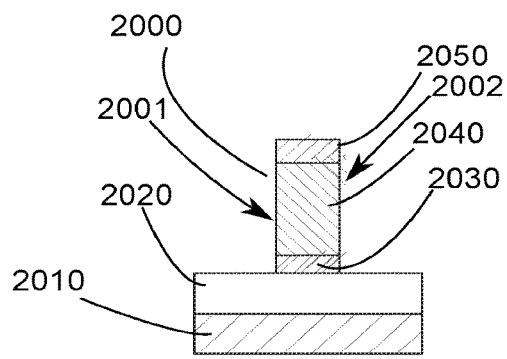
FIGS. 2a to 2h show steps according to a first embodiment of the invention.

The gate (2000, 3000) comprises, in the case of FIGS. 2a and 3a, various layers (2030, 2040, 2050, 3030, 3040, 3050):
  The layer 2030, 3030 is a layer comprising a pair of materials comprising at least one material of high dielectric permittivity referred to as High-k (for example HfO2, HfSiON . . . ) and at least one metal (for example TiN). The High-k material is advantageously a material with a high dielectric permittivity, typically greater than 15. The thickness of this layer 2030 is preferentially between 2 nm and 20 nm, advantageously between 5 nm and 10 nm, and preferably equal to 7 nm.
  The layer 2040, 3040 is preferentially made of polycrystalline silicon. The thickness of this layer 2040, 3040 is preferentially between 30 nm and 90 nm, advantageously between 40 nm and 70 nm, and preferably equal to 50 nm.

The layer 2050, 3050 is a hard mask, preferably made of silicon oxide. The thickness of this layer 2050, 3050 is preferentially between 10 nm and 60 nm, advantageously between 20 nm and 40 nm, and preferably equal to 30 nm.

In order to realize the gate (2000, 3000), shown in FIGS. 2a and 3a, a first etching using the hard mask (2050, 3050) is carried out, for example carbon fluorine chemistry and/or with a chlorine base, in order to etch the layer 2040, 3040. This etching stops on the layer 2030, 3030. The etching of the layer 2030, 3030 is advantageously carried out by BCl3 base chemistry for example non-limiting.

For example, in order to realize the gate (2000, 3000), the following conditions can be used: etching of the polycrystalline silicon: HBr/O2/Ar, TiN etching: Cl2/CH4, etching of the material with a high dielectric constant: BCl3/Ar.

Figure 2B:
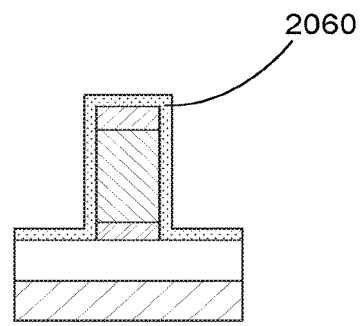

The formation of the underlying layer (2022, 3022) is preferentially preceded by a step of deposition of a dielectric layer (2060, 3060) shown in FIGS. 2b and 3b. This step is preferentially carried out by at least one deposition of a material in such a way as to form a dielectric layer (2060, 3060) on and/or around the gate (2000, 3000). Advantageously, this deposition is conformal in such a way as to cover the flanks (2001, 2002, 3001, 3002) of the gate (2000, 3000) with the dielectric layer (2060, 3060).

The dielectric layer (2060, 3060) advantageously comprises at least one material taken from: silicon nitride, boron nitride, all types of materials of which the dielectric constant is advantageously less than 7.

The thickness of the dielectric layer (2060, 3060) is more preferably between 1 nm and 30 nm, advantageously between 6 nm and 15 nm and preferably equal to 10 nm.

The deposition of the dielectric layer (2060, 3060) is for example carried out by a technique taken from at least: PECVD, PEALD.

Figure 2C:
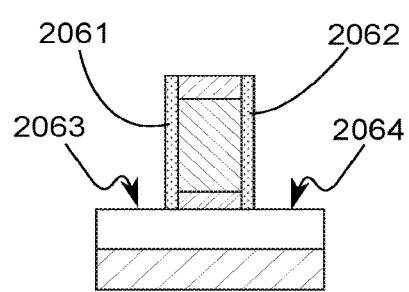

The following step shown in FIGS. 2c and 3c relates to the removal of at least a portion of the dielectric layer (2060, 3060) in order to form spacers (2061, 2062, 3061, 3062) of the gate (2000, 3000). This partial removal can be for example carried out by dry etching.

This etching is more preferably carried out on a surface (2063, 2064, 3063, 3064) of the original layer (2020, 3020). This surface (2063, 2064, 3063, 3064) corresponds more preferably to a portion of the dielectric layer (2060, 3060) that is horizontal in the figures, i.e., parallel to the face under consideration of the starting substrate. Preferably, the non-horizontal surfaces are spared at least partially.

The etching of the dielectric layer (2060, 3060) is advantageously carried out by plasma in an inductive and/or capacitive coupling reactor. The method of etching is according to the materials under consideration that comprise the dielectric layer (2060, 3060). Advantageously, this step of etching is carried out by a carbon fluorine chemical etching.

Preferentially, a preliminary step of oxidation of the dielectric layer (2060, 3060) can be carried out in order to obtain better control of the sizing of the spacers during the etching. For example, the nitride on the surface can be oxidized. Indeed, the chemistry used for example can be oxide selective, the ionic bombardment of plasma then consumes the oxide nitride on the planar portions, while the oxide is still retained on the flanks. This technique thus makes possible an anisotropic etching.

This step of removal is preferentially carried out in such a way as to leave the at least one first flank (2001, 3001) and the at least one second flank (2002, 3002) of the gate (2000, 3000) covered with the dielectric layer (2060, 3060) in order to form the spacers (2061, 2062, 3061, 3062) of the gate (2000, 3000).

Advantageously, this etching is configured to retain the dimensional of the spacers (2061, 2062, 3061, 3062), i.e. their original thickness for example, as well as a stoppage of the etching on the original layer (2020, 3020). In order to control this etching and prevent the consumption of the original layer (2020, 3020), the selectivity is preferentially between 10 and 60, advantageously between 20 and 50 and preferably equal to 30.

The chemistry that can be used for this etching is a chemistry with a CH3F/He/O2 base for example.

As such, by way of an example for the purposes of illustration, in order to etch 10 nm of SiN, the following etching parameters are possible: CH3F 200 sccm (cubic centimeters per minute)/O2 200 sccm/He 100 sccm/CH4 20 sccm with an etching speed of about 32 nm/minutes and a silicon nitride selectivity of 30.

Figure 2D:
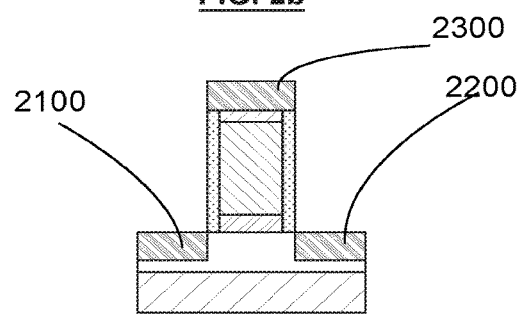
Figure 2E:
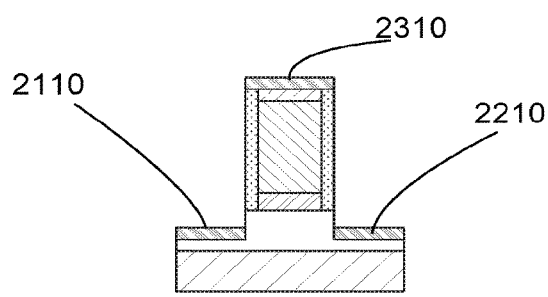

According to a first embodiment of this invention shown in FIGS. 2d and 2e, the step of transformation of at least a portion of the material (2100, 2200) of the original layer 2020 is carried out.

This transformation is carried out over a thickness preferentially at least equal to the thickness of the original layer less 3 nm, and for example between 1 nm and 47 nm, advantageously between 3 nm and 45 nm.

This transformation is carried out in such a way as to retain at least one thickness at least equal to 3 nm of the original layer 2020 in such a way as to form the peripheral portion (2023, 2024) of the underlying layer 2022.

Advantageously, the peripheral portion (2023, 2024) of the underlying layer 2022 has a thickness at least equal to 3 nm.

This step of transformation is advantageously configured to oxidize at least a portion, in particular according to its thickness, of the material of the original layer 2020. This transformation can be carried out and controlled using a plasma with a HBr/O2 base. The material of the original layer is more preferably Silicon. This step of transformation has for purpose to transform at least a portion of the material (2063, 2064) of the original layer into a portion of transformed material (2100, 2200) primarily on the horizontal surfaces of the original layer 2020, i.e. the surfaces 2063 and 2064.

As such, by way of an example for the purposes of illustration, for this step of transformation, the following oxidation parameters are possible: 10mTr-1000Ws-100Vb-HBr 50 sccm/200 sccm O2.

Outside of oxidation, any transformation configured to modify the selectivity of the original material to an etching, physical or chemical attack, is possible. This can be doping, a porosification for example.

According to an embodiment, the following step shown in FIG. 2e relates to step of partial etching of the transformed material in order to reduce the thickness of the portions of transformed material 2100 and 2200. This step of partial etching of the transformed material is advantageously carried out by an anisotropic etching, more precisely by plasma for example. This step of partial anisotropic etching then makes it possible to preferentially etch the portions of transformed material 2100 and 2200 in order to reduce their thickness.

As such, by way of an example for the purposes of illustration, for this step of etching, the following etching parameters are possible: 5mt-625Ws-200Vb-CF4 100 sccm.

This step of etching is as such configured to allow for the formation of the selectivity layer 2110 and 2210 only above the peripheral portion (2023, 2024) of the underlying layer 2022.

According to a second alternative embodiment shown in FIGS. 3*d*, 3*e* and 3*f*, a step of partial removal of the original layer 3020 is carried out after the step of etching the spacers 3061 and 3062. This step of partial removing advantageously comprises an etching more preferably carried out in such a way as to retain at least 3 nm of the original layer 3020, in such a way as to form the peripheral portion (3023, 3024) of the underlying layer 3022, for example this etching is carried out over a thickness at least equal to the thickness of the original layer 3020 less 3 nm at least.

This etching is preferentially carried out with carbon fluorine chemistry and/or with a chlorine base.

Advantageously, the step of partial removal of the original layer 3020 is configured to form a straight gate flank 3000 on gate foot 3021 according to a dimension in thickness of the original layer 3020.

Preferentially, the step of partial removal of the original layer 3020 comprises an anisotropic etching configured to attack only the portions of the original layer 3020 directed according to a dimension in thickness of said layer.

As such, by way of an example for the purposes of illustration, for this step of etching, the following etching parameters are possible: 5mt-625Ws-200Vb-CF4 100 sccm.

Ingeniously, the two preceding etchings, i.e. the etching of the gate 2000 and the etching of the original layer 2020, are carried out in the same inductive coupling plasma reactor. This allows time to be saved but also an increase in safety concerning the possible contamination of a sample during the transport thereof from one reactor to another.

Advantageously, the step of partial removal of the original layer 3020 is configured in such a way as to form a residual portion of the original layer (3123 and 3124).

According to this second embodiment, the following step shown in FIG. 3*e* consists in the step of transformation of the material of the original layer of said residual portion. This step of transformation is carried out by plasma oxidation in such a way as to form the surface layer 3200. As this transformation is anisotropic, the thickness of the horizontal 3125 and 3126 oxidized 3210 and 3220 surfaces is more substantial (between 2 and 3 nm for example) than that obtained (1 nm for example) on the flanks of the structures, for example the flanks 3001 and 3002 of the gate 3000.

As such, by way of an example for the purposes of illustration, for this step of transformation, the following oxidation parameters are possible: 10mTr-1000Ws-100Vb-200 sccm O2-Chuck 60° C. and/or HBr/O2.

According to an embodiment, the oxidation is preferentially carried out in such a way that it is more substantial on horizontal surfaces 3125 and 3126 relatively to the flanks 3001 and 3002 of the gate 3000.

According to a particular embodiment, this step of transformation can be carried out at the same time as the preceding step of partial removal of the original layer 3020 by using the following chemical parameters: CH3F/O2/He.

Advantageously, this step of transformation is then followed by a step of partial removal of the surface layer 3200 by deoxidation, shown in FIG. 3*f*, on at least one flank of the structures, i.e. on the surfaces other than the horizontal surfaces 3125 and 3126. Mainly, this deoxidation makes it possible to remove the surface layer 3200 of the gate flanks, at least on gate foot 3021. This step of deoxidation then makes it possible to retain an oxidized portion of the surface layer 3200 on surfaces 3125 and 3126 in such a way as to form the selectivity layer 3210 and 3220. For this step of partial removal of the surface layer 3200 a wet cleaning with a hydrofluoric acid can be used. The kinetics of the attack is adjusted in order to entirely consume the oxide on the vertical surfaces, on the gate flanks, without entirely consuming the oxide on the horizontal surfaces.

Figure 2F:
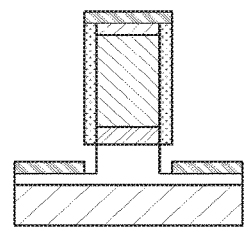
Figure 2G:
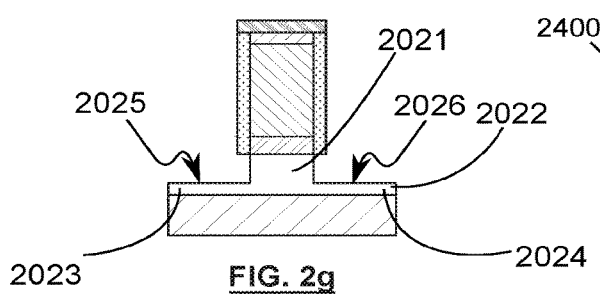
Figure 2H:
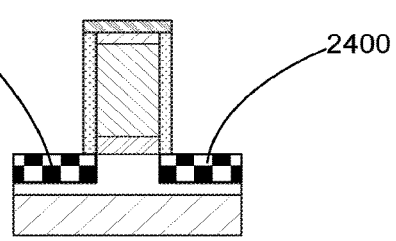

According to an embodiment, shown in FIGS. 2*f*, 2*g* and 3*g*, common to the first and second embodiments of this invention presented hereinabove, the formation of the selectivity layer (2110, 2210, 3210, 3220) is followed by a step of selective etching with respect to said selectivity layer. Advantageously this etching is a normally isotropic etching but which does not consume, or consumes slower, the selectivity layer and possible the spacers, and relates to a portion of the original layer (2020, 3020).

This etching is carried out in such a way as to consume at least a portion of the original layer (2020, 3020) until inline with the gate (2000, 3000).

This step of isotropic etching makes it possible to carry out a lateral etching in such a way as to form the gate foot (2021, 3021), more preferably below the spacers (2061, 2062, 3061, 3062).

This etching can be carried out by plasma by favoring the isotropic mode with a SF6 gas base and/or by wet method of type TMAH Tetramethylammonium Hydroxide for example.

Preferentially, the etching speed of the Silicon in these conditions is for example from 0.1 to 1 micrometer per minute.

This etching is then preferentially followed by a step of at least partial removal of the selectivity layer (2110, 2210, 3210, 3220) in such a way as to uncover the surfaces (2025, 2026, 3025, 3026) of the peripheral portion (2023, 2024, 3023, 3024) of the underlying layer (2022, 3022).

This etching is advantageously carried out by wet method, with a hydrofluoric acid base for example.

Advantageously, the gate foot (2021, 3021) has a height preferentially between 8 nm and 12 nm, advantageously between 9 nm and 12 nm, and preferably equal to 10 nm.

Advantageously, the peripheral portion (2023, 2024, 3023, 3024) of the underlying layer (2022, 3022) surrounding the gate (2000, 3000) has a thickness preferentially greater than or equal to 3 nm, and for example advantageously between 5 nm and 15 nm, and preferably equal to 10 nm.

This thickness is advantageously optimized in order to allow for the realization of later steps of integration required for the realization of the transistor, such as the formation of the Source/Drain zones 2400, 3400 shown in FIGS. 2*h* and 3*h* hereinafter.

Advantageously, the width of the gate (2000, 3000), above the gate foot (2021, 3021), is greater than or equal to the width of the gate foot (2021, 3021).

Advantageously, the width of the gate foot (2021, 3021) has a narrowing relatively to the width of the gate (2000, 3000).

Advantageously, the gate foot (2021, 3021) is located in line with the lower face of the spacers (2061, 2062, 3061, 3062).

Advantageously, the gate (2000, 3000)/gate foot (2021, 3021) structure has a mushroom shape.

According to an embodiment, shown in FIGS. 2*h* and 3*h*, common to the first and second embodiments of this invention presented hereinabove, the step of selective etching with respect to said selectivity layer is followed by a step of formation of Source/Drain zones 2400, 3400. For example non-limiting, the formation of the Source/Drain zones 2400, 3400 can be carried out by epitaxial growth and/or ionic implantation.

In FIG. 2h, and in accordance with the technical characteristics of this invention, the Source/Drain zones 2400 have at least one portion located under the spacers 2061 and 2062.

Advantageously, the Source/Drain zones 2400 are as close as possible to the gate foot 2021, and more preferably in contact with the gate foot 2021.

In FIG. 3h, and in accordance with the technical characteristics of this invention, the Source/Drain zones 3400 have at least one portion located under the spacers 3061 and 3062.

Advantageously, the Source/Drain zones 3400 are as close as possible to the gate foot 3021, and more preferably in contact with the gate foot 3021.

According to the embodiment shown in FIGS. 2h and 3h, the gate foot 2021, 3021 comprises at least partially the conduction channel between the Source/Drain zones 2400, 3400.

The invention is not limited to the embodiments described hereinabove and extends to all of the embodiments covered by the claims.

The invention claimed is:

1. A method for manufacturing a transistor, the transistor comprising:
   a gate disposed above an underlying layer of a semiconductor material, the gate comprising at least one first flank and at least one second flank, and
   a gate foot disposed under the gate in the underlying layer and protruding relative to a peripheral portion of the underlying layer, the peripheral portion surrounding the gate foot; and
the method comprising:
   forming a selectivity layer obtained from an original layer and disposed only above the peripheral portion of the underlying layer, the selectivity layer being obtained by at least:
      transforming at least a portion of a material of the original layer according to a thickness dimension of the original layer and starting from an exposed surface of the original layer so as to form a portion of transformed material configured to not expose the gate foot, and
      partially removing at least one portion of the portion of transformed material so as to retain a layer of transformed material forming the selectivity layer above the peripheral portion and so as to expose at least partially the gate foot; and
   selective etching, with respect to the selectivity layer, of the material of the original layer so as to etch the gate foot.

2. The method according to claim 1, wherein the transforming comprises a step of oxidizing the portion of the material of the original layer.

3. The method according to claim 1, wherein the selectivity layer has a thickness that is less than a height of the gate foot, so as to allow for lateral access to the gate foot.

4. The method according to claim 1, wherein the transforming provides a thickness of the peripheral portion of the underlying layer that is at least 3 nm.

5. The method according to claim 1, wherein the selective etching is an isotropic etching.

6. The method according to claim 1, wherein a width of the gate is greater than or equal to a width of the gate foot, said widths being taken in a direction perpendicular to a thickness dimension of the underlying layer.

7. The method according to claim 1, further comprising a step of removing the selectivity layer after the selective etching.

8. The method according to claim 7, wherein the step of removing the selectivity layer is performed by at least one wet etching.

9. The method according to claim 1, wherein the forming of the selectivity layer comprises, before the transforming, a step of partially removing the original layer around the gate so as to form a residual portion of the original layer, with the transforming being applied to the residual portion of the original layer.

10. The method according to claim 9, wherein the transforming is anisotropic with a maximum transformation direction directed according to the thickness dimension.

11. The method according to claim 9, wherein the step of partially removing the original layer comprises at least partially deoxidizing at least one of the first and second flanks of the gate foot.

12. The method according to claim 1, further comprising a step of forming at least one spacer, the forming comprising forming a dielectric layer at least partially covering the at least one first flank and the at least one second flank so as to at least partially not cover the gate foot.

13. The method to claim 12, wherein the step of forming the selectivity layer is performed after the step of forming the at least one spacer.

14. The method according to claim 12, further comprising, after the forming of the dielectric layer, a step of removing the dielectric layer from a surface of the original layer.

15. The method according to claim 14, wherein said step of removing is performed so as to leave the at least one first flank and the at least one second flank covered with the dielectric layer in order to form the at least one spacer.

16. The method according to claim 14, wherein said step of removing is performed by dry etching.

* * * * *